(12) United States Patent  (10) Patent No.: US 8,584,735 B2
Gerlach  (45) Date of Patent: Nov. 19, 2013

(54) COOLING DEVICE AND METHOD WITH SYNTHETIC JET ACTUATOR

(75) Inventor: David W. Gerlach, Ellington, CT (US)

(73) Assignee: Aerojet Rocketdyne of DE, Inc., Sacramento, CA (US)

( * ) Notice: Subject to any disclaimer, the term of this patent is extended or adjusted under 35 U.S.C. 154(b) by 1146 days.

(21) Appl. No.: 12/510,425

(22) Filed: Jul. 28, 2009

(65) Prior Publication Data
US 2011/0024092 A1  Feb. 3, 2011

(51) Int. Cl.
F28F 7/02 (2006.01)

(52) U.S. Cl.
USPC .......................................... 165/80.3; 165/120

(58) Field of Classification Search
USPC ............... 165/80.2, 80.3, 120, 133, 146, 147, 165/104.21, 104.33, 104.34; 361/693, 700, 361/698
See application file for complete search history.

(56) References Cited

U.S. PATENT DOCUMENTS

| | | | | |
|---|---|---|---|---|
| 2,018,163 A * | 10/1935 | Wells | ............................ | 165/147 |
| 4,156,625 A * | 5/1979 | Wachendorfer, Sr. | ........ | 156/245 |
| 5,002,123 A * | 3/1991 | Nelson et al. | .................. | 165/147 |
| 5,409,675 A * | 4/1995 | Narayanan | ..................... | 165/146 |
| 5,894,990 A | 4/1999 | Glezer et al. | | |
| 6,123,145 A | 9/2000 | Glezer et al. | | |
| 6,247,525 B1 | 6/2001 | Smith | | |
| 6,337,794 B1 * | 1/2002 | Agonafer et al. | ............. | 361/690 |
| 6,457,654 B1 | 10/2002 | Glezer et al. | | |
| 6,588,497 B1 | 7/2003 | Glezer et al. | | |
| 6,644,598 B2 | 11/2003 | Glezer et al. | | |
| 7,075,959 B1 | 7/2006 | Downing et al. | | |
| 7,193,850 B2 | 3/2007 | Pal | | |
| 7,252,140 B2 | 8/2007 | Glezer et al. | | |
| 7,334,422 B2 | 2/2008 | Zywiak et al. | | |
| 7,336,486 B2 | 2/2008 | Mongia | | |
| 2002/0118511 A1 * | 8/2002 | Dujari et al. | .................. | 361/703 |
| 2005/0121171 A1 * | 6/2005 | Mukasa et al. | ............... | 165/80.3 |
| 2006/0050482 A1 | 3/2006 | Glezer et al. | | |
| 2006/0061973 A1 | 3/2006 | Wainwright et al. | | |

FOREIGN PATENT DOCUMENTS

WO  2004075292  9/2004

* cited by examiner

*Primary Examiner* — Teresa Walberg
(74) *Attorney, Agent, or Firm* — Carlson, Gaskey & Olds

(57) ABSTRACT

A cooling device includes a heat sink body having a plurality of elongated channels that extend between respective channel inlets and outlets. A synthetic jet actuator module is adjacent to the heat sink body and includes a plurality of jet outlets adjacent to the respective channel inlets for emitting a plurality of vortices into the channels.

25 Claims, 3 Drawing Sheets

United States Patent US 8,584,735 B2

COOLING DEVICE AND METHOD WITH SYNTHETIC JET ACTUATOR

BACKGROUND OF THE INVENTION

This disclosure relates to cooling devices and, more particularly, to a cooling device that utilizes a synthetic jet actuator to reduce cooling device size and increase cooling efficiency.

Heat producing devices, such as electronic devices, generate waste heat that must be removed to maintain the device at a suitable operating temperature. For instance, electronic devices may utilize a heat sink, such as a solid medium, heat pipes, pumped loops, or the like to distribute the heat from the device to a larger area that dissipates the heat to the ambient surroundings.

The power density of electronic devices is increasing due to greater junction densities, and the amount of heat that the device produces is likewise increasing. Typical heat sinks may be scaled-up to provide greater heat-removal capacity. However, the scale-up increases the size of the heat sink and ancillary components, such as pumps or circulation hardware.

SUMMARY OF THE INVENTION

An exemplary cooling device includes a heat sink body having a plurality of elongated channels that extend between respective channel inlets and outlets. A synthetic jet actuator module is adjacent to the heat sink body and includes a plurality of jet outlets adjacent to the respective channel inlets for emitting a plurality of vortices into the channels.

Another exemplary cooling device includes a heat sink body having a first set of elongated channels that extend in a first direction between respective first channel inlets and outlets and a second set of elongated channels that extend in a second, opposite direction between respective second channel inlets and outlets. A first synthetic jet actuator module is adjacent to the heat sink body and includes a plurality of first jet outlets adjacent to the respective first channel inlets. A second synthetic jet actuator module is adjacent to the heat sink body and includes a plurality of second jet outlets adjacent to the respective second channel inlets.

An exemplary method for use with a cooling device includes emitting a plurality of vortices from a plurality of jet outlets of a synthetic jet actuator module that is adjacent to a heat sink body such that the plurality of vortices are received into respective channel inlets of a plurality of elongated channels of the heat sink body that extend between the channel inlets and outlets.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
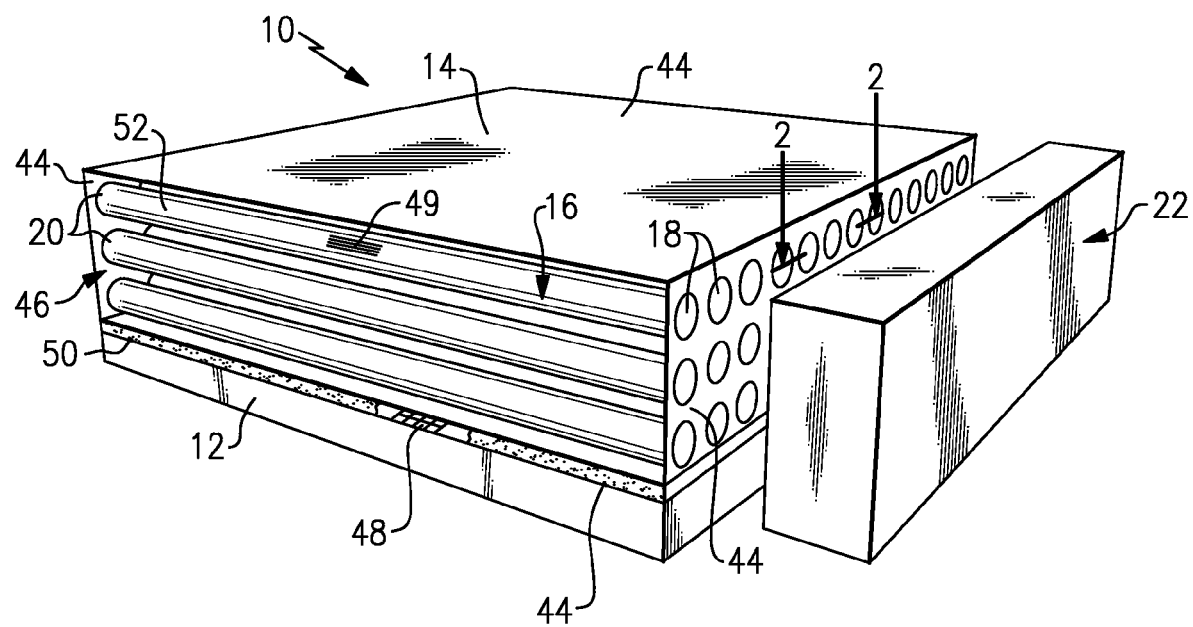
FIG. 1 illustrates an example cooling device.
Figure 2:
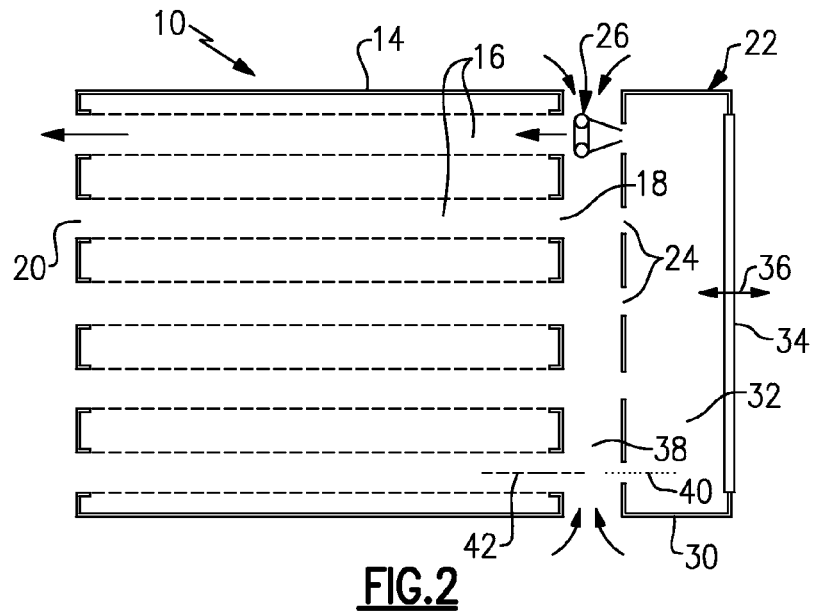
FIG. 2 illustrates a sectioned view of the cooling device of FIG. 1.

FIG. 1 illustrates a perspective view of selected portions of an example cooling device 10, and FIG. 2 illustrates a sectional view of a portion of the cooling device 10. In this example, the cooling device 10 is mounted on an electronic device 12, such as a microchip, to function as a heat sink for distribution and removal of heat produced by the electronic device 12. As may be appreciated, the cooling device 10 may be used with other types of heat producing bodies and is not limited to use in electronics. Additionally, although the cooling device 10 may be relatively small to match the size of the electronic device 12, the cooling device 10 is scalable to larger or smaller sizes to accommodate other types of heat producing bodies.

In the illustrated example, the cooling device 10 includes a heat sink body 14 having a plurality of elongated channels 16 that extend between respective channel inlets 18 and channel outlets 20. In this case, each of the channels 16 extends linearly between the respective channel inlet 18 and outlet 20 and generally includes a uniform, circular cross-sectional area along the length.

A synthetic jet actuator module 22 is arranged adjacent to the heat sink body 14 and includes a plurality of jet outlets 24 that are adjacent to the respective channel inlets 18 for emitting a plurality of vortices 26 into the channels 16 to remove heat from the heat sink body 14.

In this example, the synthetic jet actuator module 22 generally includes a housing 30 that defines an internal volume 32. One of the walls of the housing 30 includes a diaphragm 34 that is moveable along the direction 36 to change the internal volume 32 and thereby emit the vortices 26 and alternately draw fluid (e.g., air) into the internal volume 32. The synthetic jet actuator module 22 may include an actuator, such as a piezoelectric element, electromagnetic actuator, or the like, associated with the diaphragm 34 to control the movement. Given this description, one of ordinary skill in the art will recognize other synthetic jet actuator arrangements that may be used to suit their particular needs.

Movement of the diaphragm 34 to the left in FIG. 2 reduces the internal volume 32 to eject fluid from the jet outlets 24. The ejected fluid interacts with the edges of the jet outlets 24 to create the vortices 26. That is, each of the vortices 26 is similar to a "smoke ring," with a turbulent outer flow that spirals around a center volume due to the interaction of the fluid with the edges of the jet outlets 24. Each vortice 26 increases in diameter as the vortice 26 moves away from the respective jet outlet 24.

When the diaphragm 34 moves to the right in FIG. 2, the internal volume 32 increases to draw air into the synthetic jet actuator module 22. In this case, the air is drawn from the ambient surroundings (as indicated by the arrows) through a space 38 between the synthetic jet actuator module 22 and the heat sink body 14. The vortices 26 also entrain ambient air from the space 38 as the vortices 26 travel through the space 38 from the jet outlets 24 toward the channels inlets 18.

Each of the jet outlets 24 includes a centerline 40 and each of the channel inlets 18 includes a centerline 42 that may be coaxial with a respective one of the jet outlets 24. Thus, the vortices 26 are directed toward the respective channel inlets 18 and are received therein. The vortices 26 travel along the length of the channels 16 and are discharged out of the outlets 20 of the channels 16 into the ambient surroundings to dissipate absorbed heat. As the vortices 26 travel through the channel 16, the vortices 26 interact with the walls of the channels 16 to absorb heat that is transferred to the heat sink body 14 from the electronic device 12.

The heat sink body 14 may be hollow and include walls 44 that extend around an interior volume 46. The heat sink body 14 is square in the illustrated example, but may be other shapes, depending on the shape of the electronic device 12. In this case, a front wall of the heat sink body 14 is not shown in order to reveal the interior. The walls 44 may be formed from a type of material that readily transfers heat, such as a metal, alloy, composite, etc. The walls 44 may also be sealed such that the interior volume is airtight relative to the ambient surroundings.

The heat sink body 14 may also include a phase-change coolant 50 within the interior volume 46 for facilitating heat distribution. As an example, the phase-change coolant 50 may be a refrigerant, such as R134a, methanol, water, fluorocarbon, or the like. Initially, the phase-change coolant 50 may be a liquid at the bottom of the heat sink body 14 near the interface with the electronic device 12. As the phase-change coolant 50 absorbs heat from the electronic device 12, the coolant evaporates and rises through the heat sink body 14. The evaporated coolant may then condense on the outside surfaces 52 of the channels 16, thereby ejecting the absorbed heat into the vortices 26 traveling through the channels 16.

The bottom wall 44 (FIG. 1) may include a boiling enhancement surface feature 48, as shown by the cutaway portion of the phase-change coolant 50, that is exposed to the interior volume 46. Only a portion of the boiling enhancement surface feature is shown, but it may cover the entire surface of the bottom wall 44. The boiling enhancement surface feature 48 influences boiling of the phase-change coolant 50 by providing nucleation sites for the formation of evaporated gas, for example. Thus, the boiling enhancement surface feature 48 facilitates evaporation of the phase-change coolant 50. As an example, the boiling enhancement surface feature 48 may include a surface structure, a porous structure, a mesh, a surface roughness, grooves, or other feature having free gas-liquid portions or spots with lower wetting properties.

The outside surfaces 52 of the channels 16 (FIG. 1) may include a condensation enhancement surface feature 49 that is exposed to the interior volume 46. Only a portion of the condensation enhancement feature is shown, but it may cover the outside surfaces 52 of the channels 16. The condensation enhancement surface feature 49 influences condensation of the evaporated phase-change coolant 50 by providing nucleation sites for liquid droplet formation, for example. The condensation enhancement surface feature 49 may include a surface structure, a porous structure, a mesh, a surface roughness, grooves, or other feature having higher wetting properties.

Figure 3:
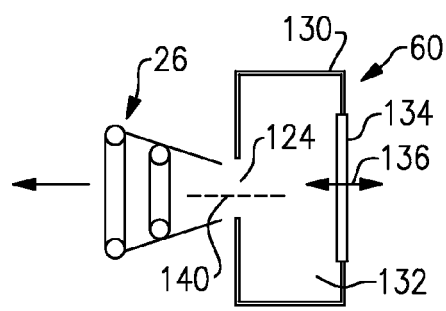
FIG. 3 illustrates an individual synthetic jet actuator.

In one modified example, the synthetic jet actuator module 22 may include a plurality of individual synthetic jet actuators, as shown in FIG. 3. In this case, each synthetic jet actuator 60 includes a diaphragm 134 that moves along direction 136 to create the vortice 26 as described above. In this disclosure, like reference numerals designate like elements where appropriate, and reference numerals with the addition of one-hundred or multiples thereof designate modified elements. The modified elements may incorporate the same features, benefits and functions of the corresponding original elements. The diaphragm 134 may be moved to the left in FIG. 3 to emit the vortice 26 and to the right in FIG. 3 to draw in fluid or air. The jet outlet 124 may have a centerline 140 that is coaxial with one of the centerlines 42 of the channel inlets 18, as described above. Thus, the cooling device 10 may include one synthetic jet actuator 60 for every channel inlet 18.

Figure 4:
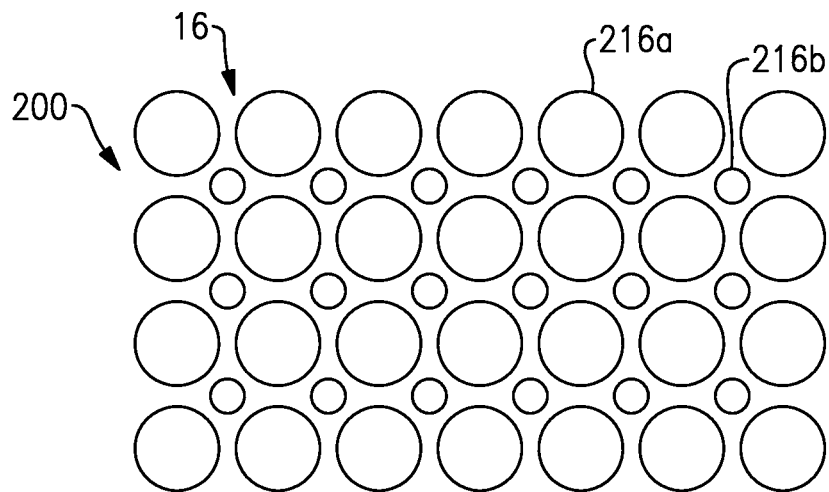
FIG. 4 illustrates an arrangement of cooling channels for a cooling device.

FIG. 4 illustrates an arrangement 200 of the channels 16 for use in the cooling device 10. In this example, the channels 16 include first channels 216a and second channels 216b. The first channels 216a are diametrically larger than the second channels 216b, which are located within interstices between the first channels 216a. Although the channels 216a and 216b are shown with circular cross-sections, other cross-sectional shapes may be used such that the cross-sectional area of each first channel 216a is larger than the cross-sectional area of each second channel 216b. The combination of the larger first channels 216a and the smaller second channels 216b provides a relatively large total outside surface area for condensation of the phase-change coolant 50.

Figure 5:
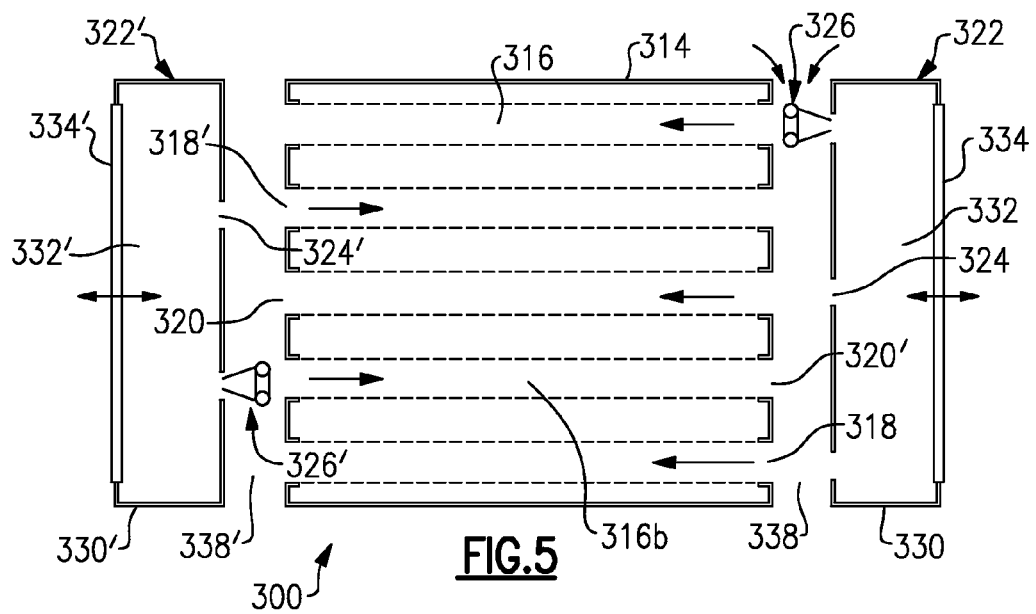
FIG. 5 illustrates another embodiment of a cooling device.

FIG. 5 illustrates another embodiment of a cooling device 310. In this case, the cooling device 310 includes a first synthetic jet actuator module 322 and a second synthetic jet actuator module 322'. Each of the modules 322 and 322' may be similar to the module 22 of the previous examples. The heat sink body 314 includes some channels 316a having channel inlets 318 adjacent to the first synthetic jet actuator module 322 and other channels 316b having channel inlets 318' adjacent to the second synthetic jet actuator module 322'.

The first synthetic jet actuator module 322 emits vortices 326 from the respective jet outlets 324 to the channels 316a. Likewise, the second synthetic jet actuator module 322' emits vortices 326' from the respective jet outlets 324' to the channels 316b. The vortices 326 travel to the left in FIG. 5 and the vortices 326' travel to the right. The synthetic jet actuator modules 322 and 322' may be modified to include additional openings in the housings 330 and 330' that are fitted with one way valves for drawing in air. The openings may be located on sides of the housings 330 and 330' do not face toward the open space 338 and 338', such that the synthetic jet actuator modules 322 and 322' avoid drawing in heated exhaust air from the respective channel outlets 320' and 320.

Figure 6:
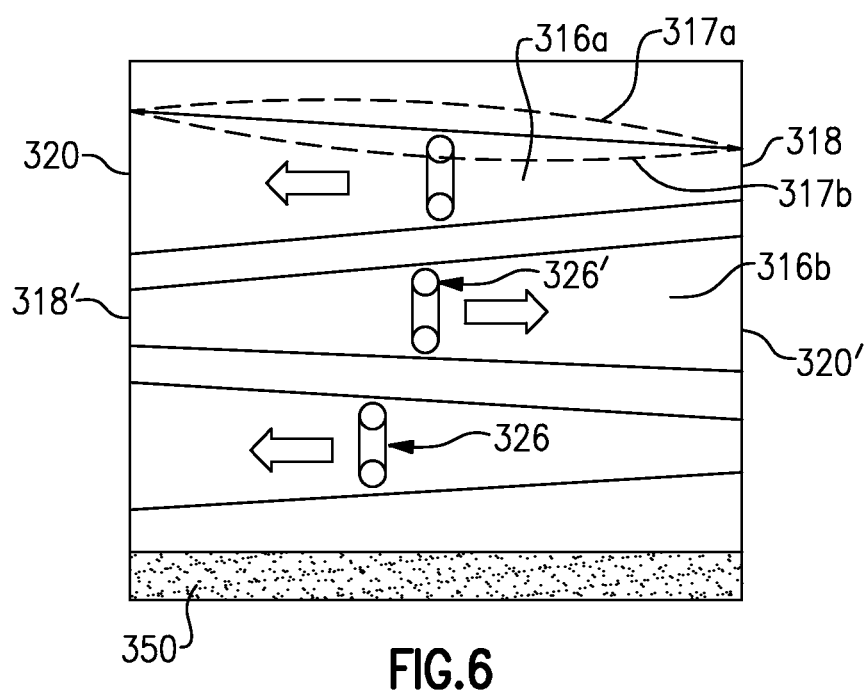
FIG. 6 illustrates conical cooling channels of a cooling device.

Referring to FIG. 6, the channels 316a and 316b of the cooling device 310 may be modified such that the channels 316a and 316b are conical. That is, each of the channels 316a and 316b is narrow at the respective channel inlets 318 and 318' and wide at the respective channel outlets 320 and 320' relative to the narrow end. The conical shape is tailored for the vortices 326 and 326'. The vortices 326 and 326' expand as they travel away from the jet outlets 324 and 324'. The conical shape of the channels 316a and 316b also expands and is thereby less restrictive on the vortices 326 and 326' to facilitate maintaining interaction between the turbulent flow of the vortices 326 and 326' and the walls of the channels 316a and 316b. The conical shape of the channels 316a and 316b may also be modified from the illustrated example such that the walls of the cone shape are either convexly curved 317a or concavely curved 317b in a rotationally symmetrically manner about the centerline.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A cooling device comprising:
   a heat sink body having a plurality of elongated channels that extend between respective channel inlets and outlets; and
   a synthetic jet actuator module adjacent to the heat sink body and including a plurality of jet outlets adjacent to the respective channel inlets for emitting a plurality of vortices into the channels, wherein a width of at least one of the plurality of jet outlet is greater than a length of at least one of the plurality of jet outlets.

2. The cooling device as recited in claim 1, wherein the synthetic jet actuator module is spaced apart from the heat sink body such that there is an open space therebetween.

3. The cooling device as recited in claim 1, wherein at least one of the plurality of elongated channels includes a cross-sectional area that is non-constant over a length of the at least one of the plurality of elongated channels.

4. The cooling device as recited in claim 1, wherein each of the plurality of elongated channels progressively increases in cross-sectional area between the respective channel inlets and outlets.

5. The cooling device as recited in claim 1, wherein a first portion of the plurality of elongated channels each have a first cross-sectional size and a second portion of the plurality of channels each have a second cross-sectional size that is different than the first cross-sectional size.

6. The cooling device as recited in claim 1, wherein each of the plurality of elongated channels are conical.

7. The cooling device as recited in claim 1, wherein each of the plurality of elongated channels are conical, with at least one of concavely curved or convexly curved walls.

8. The cooling device as recited in claim 1, wherein at least one of the plurality of elongated channels includes a cross-sectional area that is constant over a length of the at least one of the plurality of elongated channels.

9. The cooling device as recited in claim 1, wherein respective centerlines of the channel inlets are coaxial with respective centerlines of the jet outlets.

10. The cooling device as recited in claim 1, further including a phase-change coolant within the heat sink body.

11. The cooling device as recited in claim 1, further including a second plurality of elongated channels that extend between respective second channel inlets and outlets, and a second synthetic jet actuator module adjacent to the heat sink body and including a second plurality of jet outlets adjacent to the respective second channel inlets.

12. The cooling device as recited in claim 11, wherein the plurality of elongated channels have the respective channel inlets located on a first side of the heat sink body and the second plurality of elongated channels have the respective second channel inlets located on a second side of the heat sink body that is different from the first side.

13. The cooling device as recited in claim 1, wherein the heat sink body includes walls that extend around an interior volume, and the plurality of elongated channels extend through the interior volume.

14. The cooling device as recited in claim 13, wherein one of the walls includes a boiling enhancement surface feature relative to the other walls, the boiling enhancement feature being exposed to the interior volume and configured to influence boiling of a phase-change coolant within the heat sink body.

15. The cooling device as recited in claim 13, wherein outer surfaces of the plurality of elongated channels are exposed to the interior volume and include a condensation enhancement surface feature configured to influence condensation of a phase-change coolant onto the outer surfaces.

16. The cooling device as recited in claim 11, wherein the synthetic jet actuator module is located adjacent a first side of the heat sink body and the second synthetic jet actuator module is located adjacent a second side of the heat sink body opposite the first side.

17. The cooling device as recited in claim 1, wherein each of the plurality of vortices are ring shaped.

18. The cooling device as recited in claim 1, wherein at least one of the plurality of jet outlets is flush with a face of the synthetic jet actuator module.

19. The cooling device as recited in claim 1, wherein the synthetic jet actuator module includes a housing with at least one one-way valve.

20. The cooling device as recited in claim 1, wherein the synthetic jet actuator module includes a diaphragm.

21. The cooling device as recited in claim 20, wherein the diaphragm is located on an opposite side of the synthetic jet actuator module from each of the plurality of jet outlets.

22. The cooling device as recited in claim 20, wherein the diaphragm extends across substantially the width of the synthetic jet actuator module.

23. A method for use with a cooling device, comprising:
    emitting a plurality of vortices from a plurality of jet outlets of a synthetic jet actuator module that is adjacent to a heat sink body such that the plurality of vortices are received into respective channel inlets of a plurality of elongated channels of the heat sink body that extend between the channel inlets and outlets, wherein a width of at least one of the plurality of jet outlet is greater than a length of at least one of the plurality of jet outlets.

24. The method as recited in claim 23, including providing the plurality of elongated channels with a conical shape.

25. The method as recited in claim 23, wherein each of the plurality of vortices are ring shaped.

* * * * *